United States Patent
Wada

(10) Patent No.: US 7,864,002 B2
(45) Date of Patent: Jan. 4, 2011

(54) FILTER DEVICE WITH BALANCED SIGNAL INPUT AND OUTPUT TERMINALS

(75) Inventor: Koichi Wada, Yokohama (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 84 days.

(21) Appl. No.: 11/943,009

(22) Filed: Nov. 20, 2007

(65) Prior Publication Data

US 2008/0117001 A1 May 22, 2008

(30) Foreign Application Priority Data

Nov. 22, 2006 (JP) .............................. 2006-315496

(51) Int. Cl.
*H03H 9/54* (2006.01)
*H03H 9/64* (2006.01)

(52) U.S. Cl. ...................... 333/189; 333/193
(58) Field of Classification Search ......... 333/193–196, 333/187–192
See application file for complete search history.

(56) References Cited

U.S. PATENT DOCUMENTS

| 2,173,894 | A | * | 9/1939 | Atwood ...................... 333/190 |
| 2,240,142 | A | * | 4/1941 | Lovell ........................ 333/190 |
| 5,847,626 | A | * | 12/1998 | Taguchi et al. .............. 333/193 |
| 5,854,579 | A | | 12/1998 | Penunuri |
| 6,034,580 | A | * | 3/2000 | Henderson et al. .......... 333/204 |
| 6,170,154 | B1 | * | 1/2001 | Swarup ....................... 29/830 |
| 6,549,100 | B2 | * | 4/2003 | Taniguchi ................... 333/193 |
| 6,624,725 | B2 | * | 9/2003 | Ueno .......................... 333/190 |
| 6,670,866 | B2 | * | 12/2003 | Ella et al. .................... 333/133 |
| 7,042,312 | B2 | * | 5/2006 | Sul et al. .................... 333/187 |
| 2005/0212612 | A1 | * | 9/2005 | Kawakubo et al. ....... 331/117 R |
| 2006/0055488 | A1 | * | 3/2006 | Ten Dolle et al. ........... 333/190 |
| 2006/0164183 | A1 | * | 7/2006 | Tikka et al. ................. 333/133 |

FOREIGN PATENT DOCUMENTS

| JP | 48-30345 | | 4/1973 |
| JP | 51-003834 | | 1/1976 |
| JP | 11-346142 | A | 12/1999 |
| JP | 2000-022493 | | 1/2000 |
| JP | 2001-007680 | | 1/2001 |
| JP | 2002-152008 | A | 5/2002 |
| JP | 2006-502634 | A | 1/2006 |

* cited by examiner

*Primary Examiner*—Barbara Summons
(74) *Attorney, Agent, or Firm*—Arent Fox, LLP

(57) ABSTRACT

A filter device has a novel structure, satisfying requirements to have balanced input and output, with a small number of configuration elements. The above filter device includes first and second balanced signal terminals on the input side to be connected to an external balance circuit; first and second balanced signal, terminals on the output side to be connected to an external balance circuit; at least one first resonator connected in series between the first balanced signal terminal on the input side and the first balanced signal terminal on the output side; at least one second resonator connected in series between the second balanced signal terminal on the input side and the second balanced signal terminal on the output side; and at least one impedance element connected between the first balanced signal terminal on the output side and the second balanced signal terminal on the input side.

21 Claims, 6 Drawing Sheets

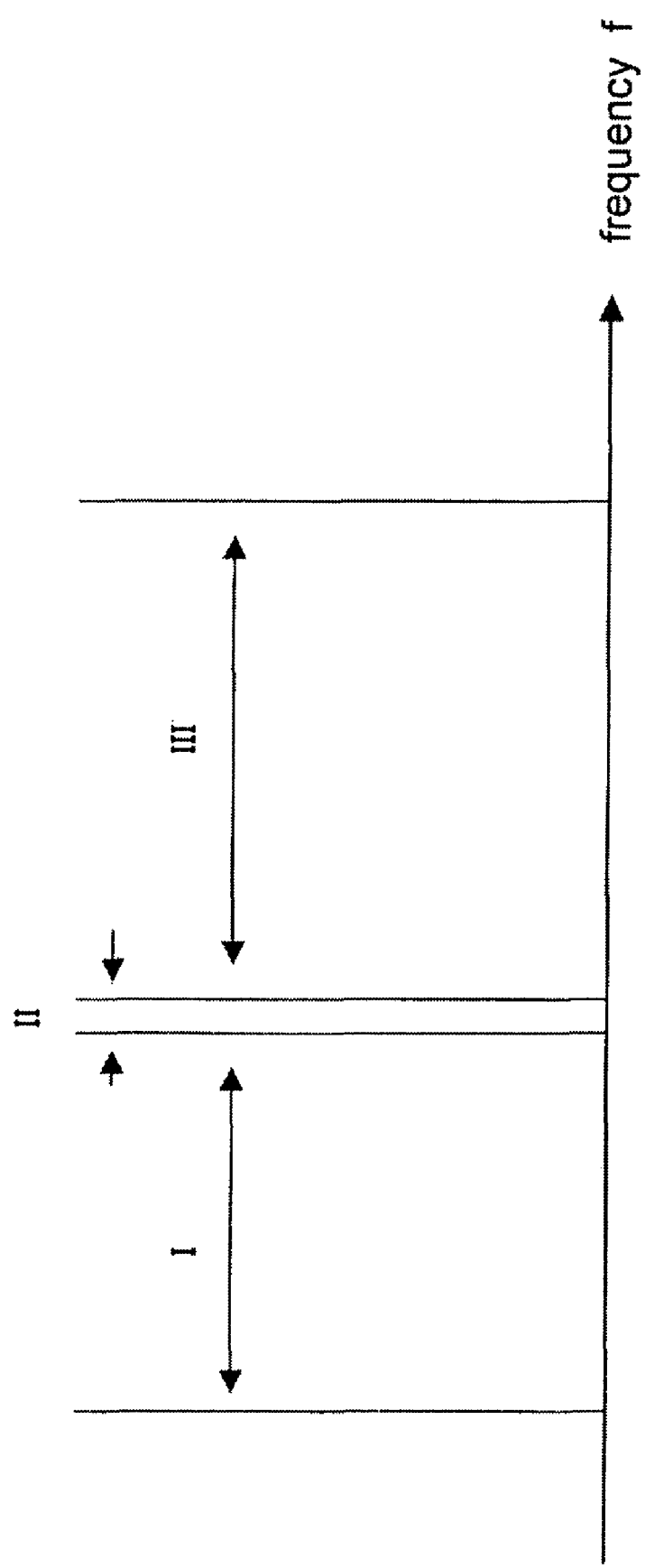

FILTER DEVICE WITH BALANCED SIGNAL INPUT AND OUTPUT TERMINALS

CROSS-REFERENCE TO RELATED APPLICATIONS

This application is based upon and claims the benefit of priority from the prior Japanese Patent Application No. 200-315496, filed on Nov. 22, 2006, the entire contents of which are incorporated herein by reference.

BACKGROUND OF THE INVENTION

1. Field of the Invention

The present invention relates to a filter device, and more particularly, a filter device constituted of an acoustic wave element such as a surface a coustic wave (SAW) element having a resonance characteristic in the VHF and UHF bands.

2. Description of the Related Art

The filter device is widely used in the communication field. In particular, the filter device using a surface acoustic wave (SAW) resonator, or a surface acoustic wave (SAW) filter (hereinafter generically termed SAW element), is largely used for mobile communication such as mobile telephone, because of being able to be compact in size, with a low loss.

In recent years, mobile telephone becomes to have high functionality, and TV broadcast has become possible to view by a mobile phone having a mounted TV tuner. Particularly in Japan, types of mobile phones capable of receiving "one-segment" broadcast, a type of digital TV broadcast, have been increasing.

For example, when a TV tuner is mounted on a WCDMA mobile phone (transmission signal of 830-840 MHz) in the Japanese domestic telephone operating companies, the frequency band I of one-segment broadcast is 470-840 MHz, as shown in FIG. 1. However, when viewed from the TV tuner for one-segment broadcast, WCDMA transmission signal II (830-840 MHz) is a cause of trouble such as crosstalk.

Accordingly, a band pass filter capable of passing only the one-segment broadcast frequency band I is necessary on the one-segment broadcast TV tuner side.

As an element for realizing the band passfilter, compactness is a necessary condition when taking into consideration to mount on portable equipment. As a compact filter element, the use of an acoustic filter such as surface acoustic wave (SAW) device may be considered. However, since the frequency band I of the one-segment broadcast is a wideband of 470-770 MHz, it is difficult to realize a bandpass filter of such wideband by use of the SAW device.

Incidentally, in FIG. 1, the frequency band III is a frequency bard for use in another mobile telephone system, and therefore has no relation to the WCDMA portable equipment in the present example.

Accordingly, the use of a band elimination filter for attenuating the WCDMA transmission signal II (830-840 MHz) may be considered. In such the case, the high frequency (770 MHz) side of the one-segment TV broadcast signal is exceedingly close to the low frequency (830 MHz) side of the WCDMA mobile telephone signal. Therefore, the band elimination filter is required to have a steep cut-off characteristic.

Meanwhile, usually, the filter device is also required to have balanced input and output because an element having balanced terminals, such as a frequency converter, an amplifier, or the like, is connected before and after the filter device. As a conventional method to realize the band elimination filter, a method using a ladder-type structure (as disclosed in the U.S. Pat. No. 5,854,579) shown in FIG. 2 has been known, which has, however, unbalanced input and output.

Also, as shown in FIG. 3, there have been devised methods for realizing balanced input and output using a ladder type (as in the Japanese Unexamined Patent Publication Nos. Hei-11-346142, 2000-22493 and 2001-7680).

The band elimination filter using a ladder-type structure shown in FIG. 2 has unbalanced input and output. When the above band elimination filter is connected to an element having balanced terminals, it is not possible to connect directly, and an unbalance-balance converter is necessary.

In contrast, the filter shown in FIG. 3 is of ladder-type structure having balanced input and output. However, the number of resonator elements becomes large, which does not meet the requirement to make a device element compact.

Considering the above-mentioned points, the inventors of the present application have been studying a variety of band elimination filter types having balanced input and output with a reduced number of configuration elements, and come to obtain a novel band elimination filter structure that meets the aforementioned requirement and has a desired steep cut-off characteristic.

SUMMARY OF THE INVENTION

Accordingly, it is an object of the present invention to provide a band elimination filter having a novel structure that meets the requirements of balanced input and output and having a small number of configuration elements.

As a first aspect of the present invention to solve the aforementioned object, a filter device including a filter circuit having resonators is provided. The above filter circuit includes a first and a second balanced signal terminal on the input side to be connected to an external balance circuit; a first and a second balanced signal terminal on the output side to be connected to an external balance circuit; at least one first resonator connected in series between the first balanced signal terminal on the input side and the first balanced signal terminal on the output side; at least one second resonator connected in series between the second balanced signal terminal on the input side and the second balanced signal terminal on the output side; and at least one impedance element connected between the first balanced signal terminal on the output side and the second balanced signal terminal on the input side.

In the above first aspect, it may also be possible to configure in such a manner that at least one impedance element is connected in series with at least one of the first resonator and the second resonator.

Further, in the above first aspect, it may also be possible to configure in such a manner that at least one impedance element is connected in parallel with at least one of the first resonator and the second resonator.

Further, in either one of the above structures, it is possible to configure in such a manner that a plurality of filter circuits are connected.

The features of the present invention will become more apparent by the following description of the embodiments illustrated with the accompanied drawings.

BRIEF DESCRIPTION OF THE DRAWINGS

FIG. 1 shows a diagram illustrating the frequency band of one-segment broadcast.

DETAILED DESCRIPTION OF THE PREFERRED EMBODIMENTS

The preferred embodiment of the present invention is described herein after referring to the charts and drawings. However, it is noted that the embodiments are disclosed for the sake of explanation of the present invention, and accordingly, the scope of the present invention is not limited to the embodiments described below.

Figure 3:
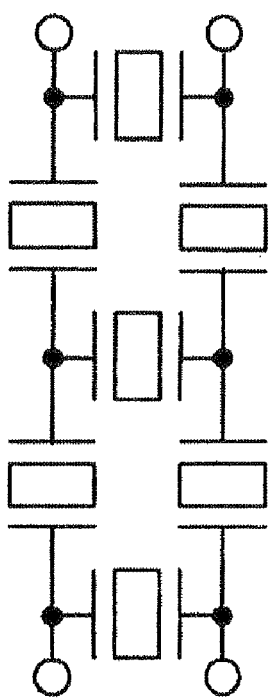
FIG. 3 shows a diagram illustrating a conventional case of realizing a filter of balanced input and output with a ladder structure.
Figure 2:
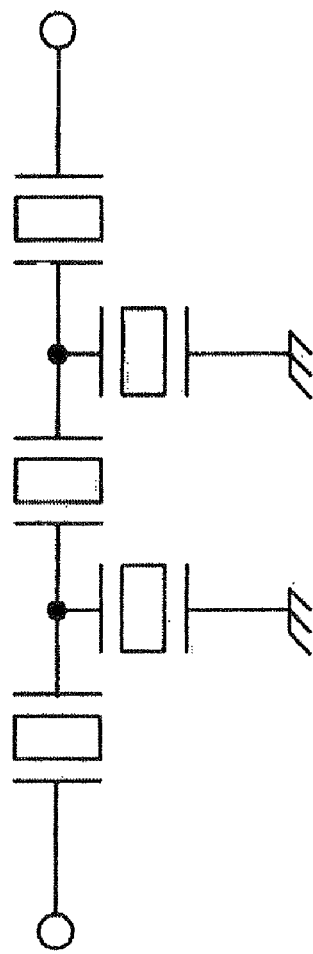
FIG. 2 shows a diagram illustrating a conventional case of realizing a band elimination filter with a ladder structure.
Figure 4:
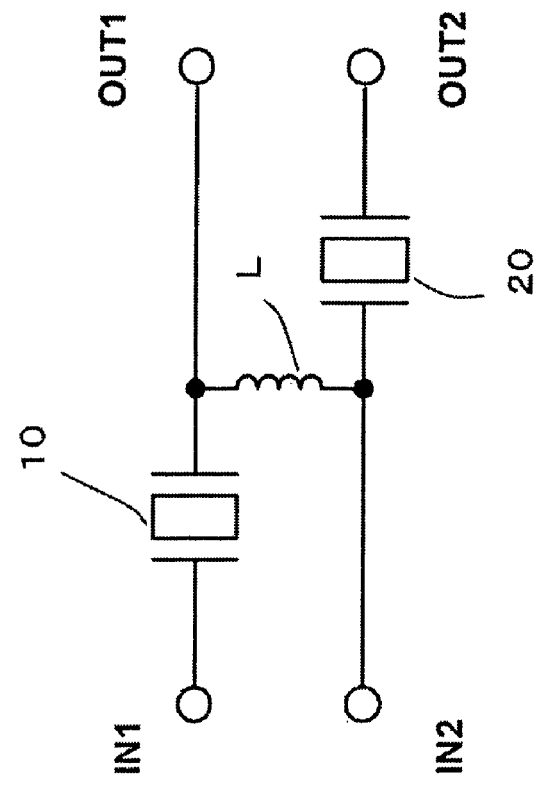
FIG. 4 shows a diagram illustrating an embodiment of the present invention.

FIG. 4 shows a diagram illustrating a structure according to one embodiment of the present invention. There are provided balanced signal terminals IN1, IN2 on the input side to be connected to a non-illustrated external balance circuit, and balanced signal terminals OUT1, OUT2 on the output side to be connected to also a non-illustrated external balance circuit.

Further, there are provided at least one first resonator 10 being connected in series between the first balanced signal terminal IN1 on the input side and the first balanced signal terminal OUT1 on the output side, and also at least one second resonator 20 being connected in series between the second balanced signal terminal IN2 on the input side and the second balanced signal terminal OUT2 on the output side.

Further, as a feature, there is provided at least one impedance element 30 being connected between the above first balanced signal terminal OUT1 on the output side and the second balanced signal terminal IN2 on the input side. With such the structure, it is possible to realize a balanced input and output filter with an exceedingly small number of elements, namely, two resonators and one impedance element in the minimum.

Figure 5:
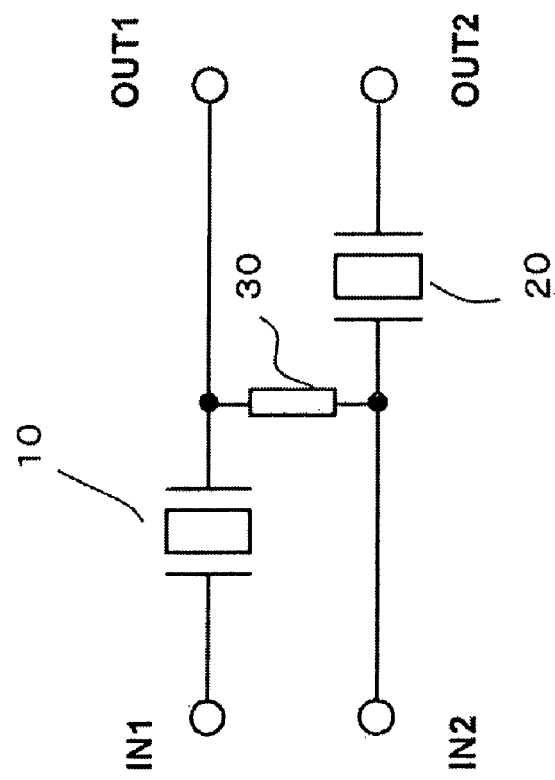
FIG. 5 shows a diagram in which an inductive element is used as impedance element, among the embodiments of the present invention.

FIG. 5 shows a diagram illustrating an example in which an inductive element L is used as impedance element 30 in the structure shown in FIG. 4. Further, in the application of the present invention, resonators 10, 20 are not limited to particular elements. However, when an acoustic wave element such as surface acoustic wave (SAW) element, bulk acoustic wave (BAW) element, piezoelectric thin film resonator (FBAR) is used, high resonance Q value is obtainable. With this, a steeper cut-off characteristic can be realized. Also, because the acoustic wave element can be disposed on an identical piezoelectric substrate, miniaturization can easily obtained.

Al so, the above-mentioned impedance element 30 is not limited to the inductive element L. The effect of the present invention is not varied even when a capacitive element, a resonance element, or the like, or either a lumped constant element or a distributed constant element is used.

Figure 6:
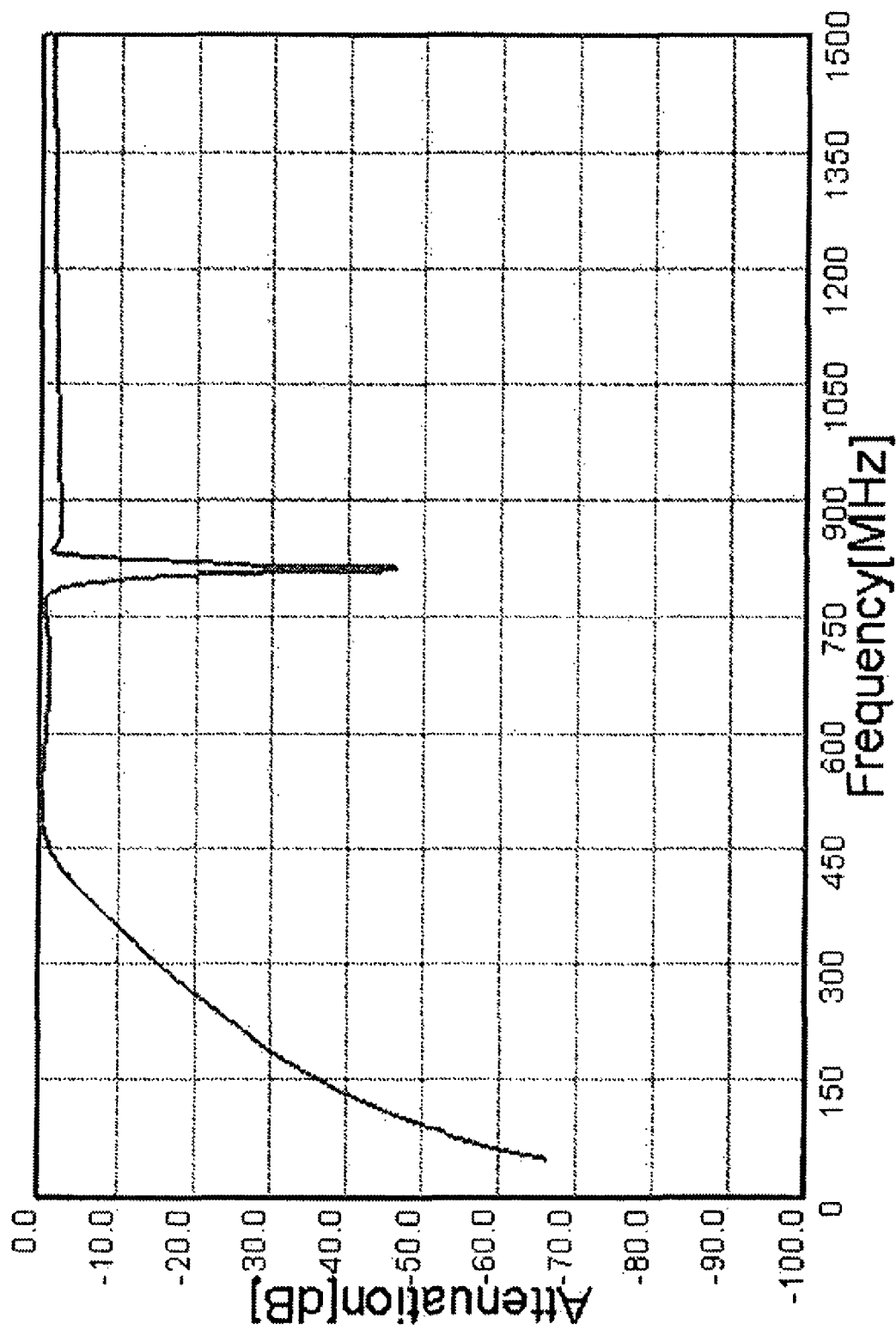
FIG. 6 shows a diagram illustrating an exemplary characteristic of the embodiment shown in FIG. 4.

FIG. 6 shows a diagram illustrating an exemplary frequency characteristic of the band elimination filter shown in FIG. 5 to which the present invention is applied. In the example, such a characteristic as the combination of a high pass filter with a band elimination filter is represented.

Namely, there is a small loss in the frequency range of no lower than a frequency of 470 MHz, representing the characteristic of a high pass filter. Further, in the high pass range, a frequency band of 830-840 MHz becomes a large attenuation range (band elimination range). Therefore, the frequency band I of the one-segment broadcast can be received without suffering interference from the WCDMA transmission signal II (830-840 MHz) as described earlier.

Through the inspection having been conducted by the inventors of the present application, it is understood that the frequency characteristic in the above attenuation range is determined substantially by the antiresonant frequency of resonators 10, 20, and that the passband of 470-770 MHz is formed by the resonance between the inductive element L and electrode capacity of resonators 10, 20.

Further, on the lower frequency side than 470 MHz, there is formed an attenuation range, of which characteristic is determined by the relationship between the inductive element L, and the electrode capacity of resonators 10, 20, also.

In the domestic Japan, analog 1-12 channel TV broadcast exists in 90-220 MHz. When viewed from the TV tuner for one-segment broadcast, the above analog TV broadcast signal is also a useless signal, and therefore, it is convenient to be attenuated.

Now, to mount the filter device having a structure according to the present invention, it is possible to make a single product by housing band filter resonators 10, 20 and impedance element 30 in an identical package. Also, instead of housing thoroughly in an identical package, it is possible to externally mount at least one impedance element 30 among the impedance elements, as externally attached component, which is to be mounted at the time of mounting on a printed circuit board, etc. Further, particularly when resonators 10, 20 in the structure of the present invention are acoustic wave elements, it is also possible to form impedances element 30 on the same piezoelectric substrate as the above resonators 10, 20 are mounted on.

Figure 7:
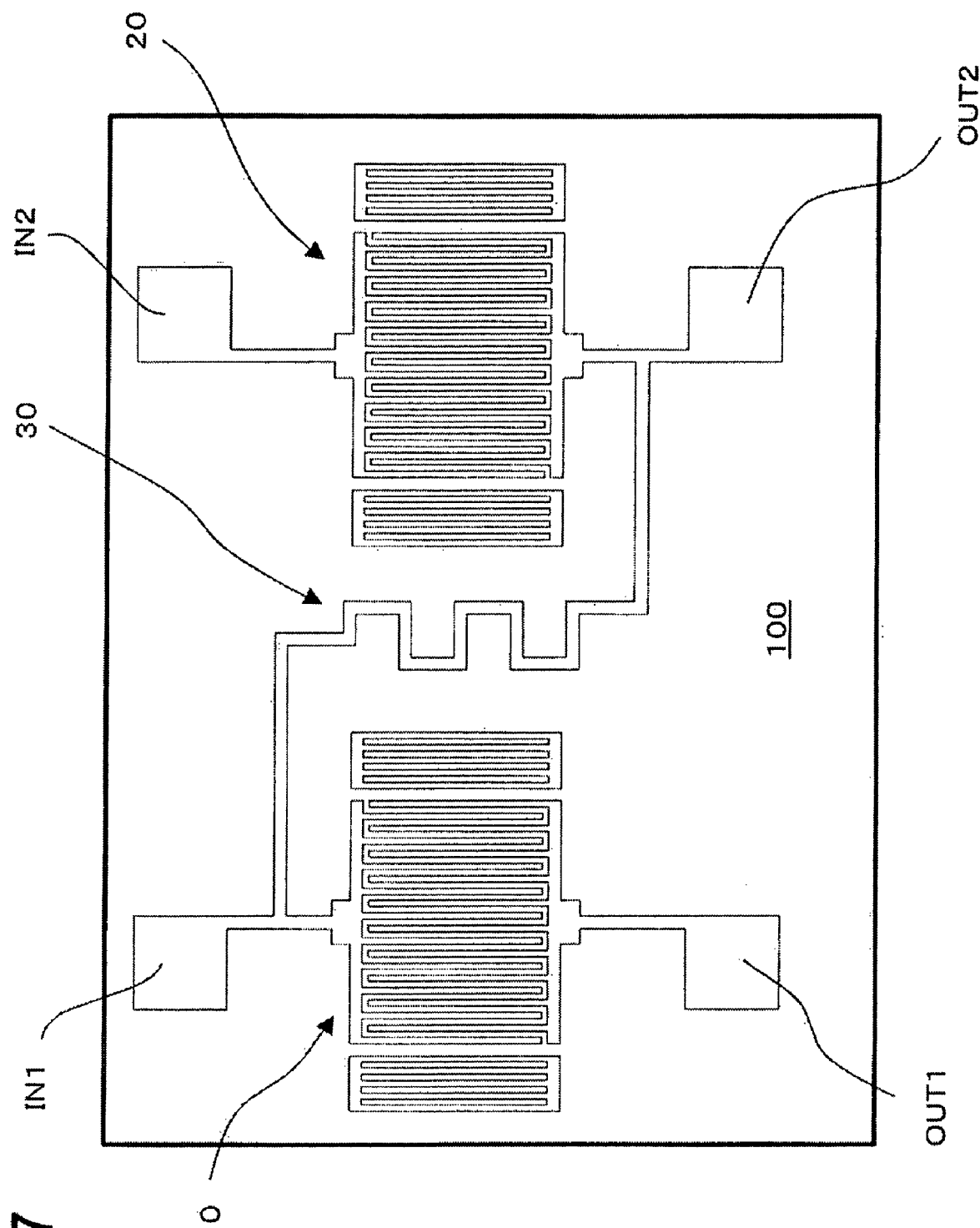
FIG. 7 shows a diagram illustrating an exemplary layout of the embodiment shown in FIG. 4.

As a typical example, FIG. 7 shows an exemplary layout in case surface acoustic wave resonators are applied for resonators 10, 20 in the structure of the preset invention, and an inductive element is applied for impedance element 30.

According to the layout shown in FIG. 7, a compact structure can be obtained by disposing surface acoustic wave resonators 10, 20 and inductive element 30, as impedance element, or an identical piezoelectric substrate 100.

In the layout shown in FIG. 7, when an impedance element value of inductive element 30, etc. becomes large, disposition on the identical substrate becomes difficult. Therefore, using a lumped constant element, a distributed constant element, or the like, it may be possible to form the impedance element on a different substrate from piezoelectric substrate 100, and to dispose in an identical package.

Alternatively, it may also be possible to dispose the impedance element outside the package as externally attached component, or to include the impedance element function in the own package by use of LTCC (Low Temperature Cofired Ceramics), etc.

Meanwhile, when a capacitive element is applied to impedance element 30 in the structure according to the present invention, it is also possible to make the passband portion exceedingly narrow.

Further, when attention is paid on the band elimination portion, by letting resonators 10, 20 to have a virtually equal frequency characteristic, it is possible to strengthen the attenuation amount in the band elimination portion.

Meanwhile, by letting the two resonators in the structure of the present invention to have virtually different frequency characteristics, particularly to have different antiresonant frequencies, it becomes possible to broaden the frequency range in the band elimination portion, though the attenuation amount in the band elimination portion is mitigated. Particularly, with regard to the two resonators in the structure of the present invention, by setting the antiresonant frequency of any one resonator to be a frequency between the resonant frequency and the antiresonant frequency of the other resonator, it is possible to broaden the band elimination frequency band, without causing a large deterioration of the attenuation amount in the band elimination portion.

Figure 8:
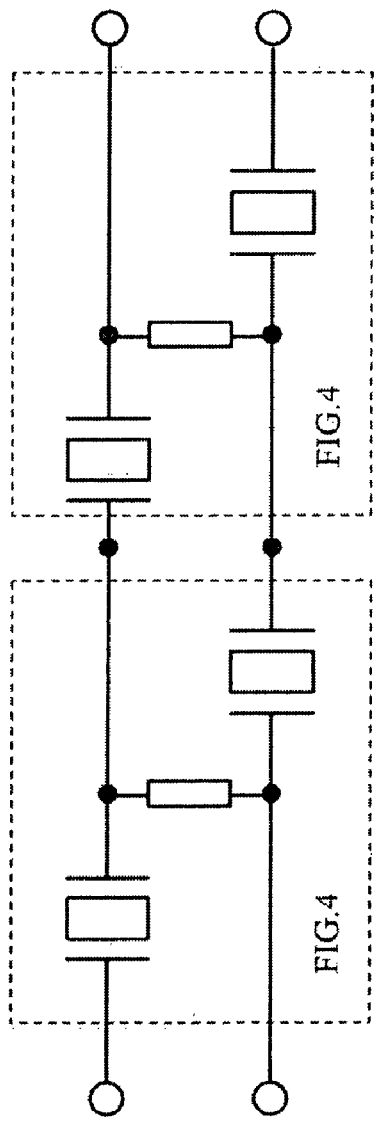
FIG. 8 shows a diagram illustrating an example of the present filter devices in cascade connection, among the embodiments of the present invention.

Also, as shown in FIG. 8, it is possible to strengthen the attenuation in the stop range more, by connecting in cascade at least two or more filter devices having the structures according to the present invention. Or, it is also possible to reduce input/output impedance by connecting at least two or more filter devices in parallel.

Figure 10:
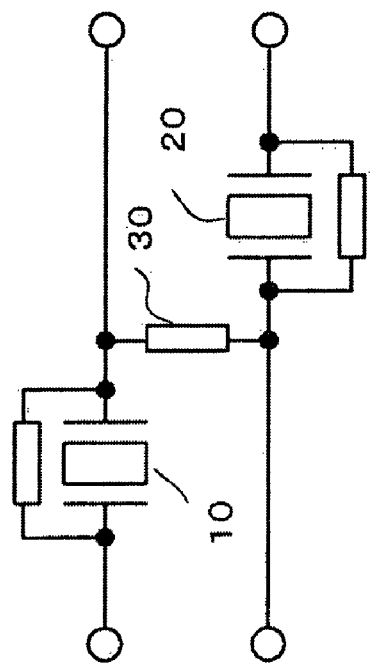
FIG. 10 shows a diagram illustrating an example in which impedance elements are connected in parallel with resonators, among the embodiments of the present invention.
Figure 9:
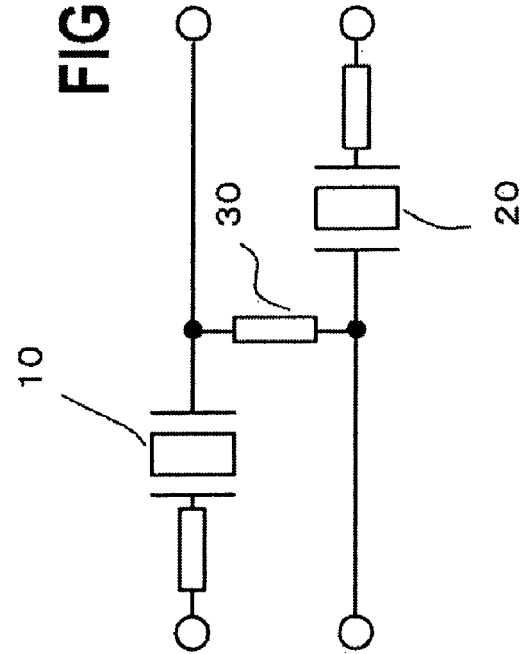
FIG. 9 shows a diagram illustrating an example in which an impedance element is connected in series with resonators, among the embodiments of the present invention.

Further, in the structure according to the present invention, by connecting at least one impedance element 30 in series with at least one resonator, as shown in FIG. 9, or by connecting in parallel as shown in FIG. 10, it is possible to vary an apparent resonance characteristic.

With this, it is also possible to adjust the filter characteristic. The impedance element type being connected in series, or in parallel, to the resonator described here is not limited, similar to the above description.

Moreover, when it is required to obtain unbalanced input or output, it is possible to connect a balance-unbalance conversion means on at least one of the input and output sides of the filter device of the present structure. The above balance-unbalance conversion means may be contained in the identical package to the filter device of the present structure, or included in the own package by LTCC, etc., or may be an externally attached component when mounting the filter device on a printed circuit board, etc.

As having been described, according to the present invention, it is possible to realize a filter of balanced input and output with a small number of elements. Also, a steep cut-off characteristic can be realized. With this, it becomes possible to design a compact filter device having an excellent characteristic.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A filter device including a filter circuit consisting of:
   first and second balanced signal input terminals to be connected to an external balance circuit;
   first and second balanced signal output terminals to be connected to an external balance circuit; and
   a series circuit of first through third branches, wherein
   a first terminal of the first branch is the first balanced signal input terminal,
   a first terminal of the second branch is the second balanced signal output terminal,
   a connection point of a second terminal of the first branch and a first terminal of the third branch is the first balanced signal output terminal, and
   a connection point of a second terminal of the second branch and a second terminal of the third branch is the second balanced signal input terminal, wherein
   the first branch comprises a first resonator, the second branch comprises a second resonator, and the third branch comprises a first impedance element.

2. The filter device according to claim 1, wherein at least one of the first and second branches comprise a second impedance element is connected in series with at least one of the first resonator and the second resonator.

3. The filter device according to claim 1, wherein at least one of the first and second branches comprise a second impedance element connected in parallel with at least one of the first resonator and the second resonator.

4. The filter device according to claim 1, wherein the first and the second resonators have a virtually equal frequency characteristic.

5. The filter device according to claim 1, wherein the first and the second resonators and the impedance element are housed in an identical package.

6. The filter device according to claims 1, wherein the first impedance element is an externally connected element disposed outside a package.

7. The filter device according to claim 1, wherein the first and the second resonators are acoustic wave elements.

8. The filter device according to claim 7, wherein the first and the second resonators are surface acoustic wave (SAW) elements.

9. The filter device according to claim 7, wherein the first and the second resonators are bulk acoustic wave (BAW) elements.

10. The filter device according to claim 7, wherein the first and the second resonators are piezoelectric thin film resonator (FBAR) elements.

11. The filter device according to claim 1, wherein the first and the second resonators are formed on an identical piezoelectric substrate.

12. The filter device according to claim 11, wherein the first impedance element is formed on the piezoelectric substrate.

13. The filter device according to claim 1, wherein the first impedance element is an inductive element.

14. The filter device according to claim 1, wherein the first impedance element is a capacitive element.

15. The filter device according to claim 1, wherein the first impedance element is configured of a lumped constant element.

16. The filter device according to claim 1, wherein the first impedance element is configured of a distributed constant element.

17. The filter device according to claim 1, further comprising: a balance-unbalance conversion means on at least one of the input side and the output side.

18. The filter device according to claim 1, wherein the filter circuit functions as a band elimination filter.

19. A filter device including a plurality of filter circuits connected in cascade, each of the plurality of filter circuits consisting of:
   first and second balanced signal input terminals to be connected to an external balance circuit;
   first and second balanced signal output terminals to be connected to an external balance circuit; and a series circuit of a first resonator, an impedance element, and a second resonator, wherein a first terminal of the first resonator is the first balanced signal input terminal, a first terminal of the second resonator is the second balanced signal output terminal, a connection point of a second terminal of the first resonator and a first terminal of the impedance element is the first balanced signal output terminal, and a connection point of a second terminal of the impedance element and a second terminal of the second resonator is the second balance signal input terminal.

20. A filter device including a filter circuit comprising:

first and second balanced signal input terminals to be connected to an external balance circuit;

first and second balanced signal output terminals to be connected to an external balance circuit; and a series circuit of a first resonator, an impedance element, and a second resonator, wherein a first terminal of the first resonator is the first balanced signal input terminal, a first terminal of the second resonator is the second balanced signal output terminal, a connection point of a second terminal of the first resonator and a first terminal of the impedance element is the first balanced signal output terminal, and a connection point of a second terminal of the impedance element and a second terminal of the second resonator is the second balanced signal input terminal, and wherein the first and the second resonators have a virtually different frequency characteristics.

21. A filter device including a filter circuit comprising:

first and second balanced signal input terminals to be connected to an external balance circuit;

first and second balanced signal output terminals to be connected to an external balance circuit; and a series circuit of a first resonator, an impedance element, and a second resonator, wherein a first terminal of the first resonator is the first balanced signal input terminal, a first terminal of the second resonator is the second balanced signal output terminal, a connection point of a second terminal of the first resonator and a first terminal of the impedance element is the first balanced signal output terminal, and a connection point of a second terminal of the impedance element and a second terminal of the second resonator is the second balanced signal input terminal, and wherein the antiresonant frequency of one resonator of the first and the second resonators is a frequency between the resonant frequency and the antiresonant frequency of the other resonator.

* * * * *